US008269181B2

(12) United States Patent
Saveliev

(10) Patent No.: US 8,269,181 B2
(45) Date of Patent: Sep. 18, 2012

(54) AVALANCHE PIXEL SENSORS AND RELATED METHODS

(75) Inventor: Valeri Saveliev, Hamburg (DE)

(73) Assignee: Positron Corporation, Westmont, IL (US)

( * ) Notice: Subject to any disclaimer, the term of this patent is extended or adjusted under 35 U.S.C. 154(b) by 963 days.

(21) Appl. No.: 12/249,274

(22) Filed: Oct. 10, 2008

(65) Prior Publication Data

US 2009/0095887 A1 Apr. 16, 2009

Related U.S. Application Data

(60) Provisional application No. 60/960,708, filed on Oct. 10, 2007.

(51) Int. Cl.
*H01J 40/14* (2006.01)
(52) U.S. Cl. ............. 250/370.01; 250/208.1; 250/204; 250/214 R
(58) Field of Classification Search .......... 250/370.01, 250/208.1, 214.1, 214 R
See application file for complete search history.

(56) References Cited

U.S. PATENT DOCUMENTS

| 7,238,943 | B2* | 7/2007 | Wong et al. ............ 250/367 |
| 2005/0012033 | A1 | 1/2005 | Stern et al. |
| 2005/0139777 | A1* | 6/2005 | Rostaing et al. ........ 250/394 |
| 2008/0156993 | A1 | 7/2008 | Weinberg et al. |
| 2008/0203309 | A1* | 8/2008 | Frach et al. ............ 250/362 |
| 2011/0233413 | A1* | 9/2011 | Prescher et al. ....... 250/370.01 |

OTHER PUBLICATIONS

Golovin et al. Novel type of avalanche photodetector with Geiger mode operation; 2004; Nuclear Ins. and Methods in Phys. Re A 518 560-654.*
Moehrs et al.;A detector head design for small-animal PET with silicon photomultipliers (SiPM); Feb 9. 2006; Phys. Med. Biol. pp. 1-17.*
Claus, et al., Monolithic active pixel sensors for a linear collider, Nuclear Instruments and Methods in Physics Research A 473 (2001) 83-85.
Chaubaud, et al., The DELPHI silicon strip microvertex detector with double sided readout, Nuclear Instruments and Methods in Physics Research A 368 (1996) 314-332.
Turchetta, ,CMOS Monolithic Active Pixel Sensors (MAPS) for future vertex detectors, SNIC Symposium, Stanford, Cal., (Apr. 2006) 1-4.

* cited by examiner

*Primary Examiner* — David Porta
*Assistant Examiner* — Djura Malevic
(74) *Attorney, Agent, or Firm* — Berenato & White, LLC

(57) ABSTRACT

According to an embodiment, an avalanche pixel sensor includes a substrate having opposite first and second surfaces, first sensor elements operating in breakdown mode situated on the first surface of the substrate for detecting ionizing radiation from a radiation-emission source, second sensor elements operating in breakdown mode situated on the second surface of the substrate, the second sensor elements each paired with a corresponding first sensor element to experience substantially coincident breakdown in response to ionizing radiation. Logic elements are each electrically interconnected to a respective pair of first and second sensor elements for receiving a signal or signal representing the substantially coincident breakdown of the respective pair to be distinguished from a dark signal even in either of the pair of the first and second sensor elements. Additionally, a detector array, a sensing apparatus, and a method of detecting ionization radiation using first and second sensor elements disposed on opposite sides of a substrate are also provided.

25 Claims, 7 Drawing Sheets

AVALANCHE PIXEL SENSORS AND RELATED METHODS

This application claims the benefit of priority of U.S. provisional application 60/960,708 filed Oct. 10, 2007, the complete disclosure of which is incorporated herein by reference.

FIELD OF THE INVENTION

The present invention relates to low cost semiconductor position and/or intensity sensitive detectors for charged particle tracking and imaging with high intrinsic gain. The present invention further relates to apparatus, systems and methods employing the semiconductor detectors. The present invention possesses applicability with respect to a variety of fields, including nuclear medical systems, medical imaging systems, homeland security systems, precise systems for detecting coordinate and intensity of elementary particles in experimental high energy physics and other applications.

BACKGROUND OF THE INVENTION

Important considerations in the selection of position sensitive and intensity detectors include high efficiency, coordinate precision, time response and background conditions. Other important considerations include operating conditions, stability, compatibility with high electromagnetic and radiation field environments, physical size, and material budget and fabrication cost.

Silicon micro strip technology is principal detector technology employed in the area of semiconductor intensity and coordinate detection of ionizing particles. Silicon micro strip technology is based on a method of detecting ionization losses in semiconductors by situating an array of the strip electrodes on a substrate and collecting the charge created during the process of ionization, when charged particles cross the sensitive volume of the strip detector. A disadvantage of this technology resides in the relatively thick sensitive area (e.g., 300 to 400 microns) needed to provide a signal high enough to detect the particles over noise. The sensitive area thickness significantly increases the material budget and decreases coordinate measurement precision. Special semiconductor material may be selected to reduce the depletion area thickness; however, the material is expensive.

Monolithic active pixel sensor technology also has been employed in the area of intensity and coordinate detection of ionizing particles. "A monolithic active pixel sensor for charged particles and imaging using standard VLSI CMOS technology," *Nuclear Instruments and Methods in Physics Research*, A458, 2001. Active pixel sensors are generally made using standard VLSI technology, usually CMOS. Each active pixel sensor includes a sensing element formed in a semiconductor substrate and amplifier integrated in the sensors and capable of converting ionization losses into electronic signals. Once collected the charge carriers are transferred to output circuitry for processing. The active pixel sensor technology may be employed to provide two dimensional coordinate detectors. Disadvantages of the technology include low signal to noise ratio, poor efficiency, and complexity, such as the placement of analog electronics on the same substrate with sensitive elements.

The publication of Golovin and Saveliev, entitled "Novel type of avalanche photodetector with Geiger mode operation," Nuclear Instruments and Methods in Physics Research" 518 (2004) 560-564 discloses an avalanche photosensor with a structure including multiple Geiger mode operation cells with a quenching mechanism (resistive layer) and a common electrode. The structure is also referred to as a silicon photomultiplier. An absorbed photon entering the micro-cell generates an electron-hole pair. Due to a high electric field inside the micro-cell, a drifting electron can generate a large number of electron-hole pairs via an avalanche process, resulting in break down of the pn junction of the micro-cell. The resistive layer covers the avalanche structure of the micro-cell for the purpose of quenching the avalanche process in the micro-cell.

The physics of semiconductor avalanche photo detectors such as silicon photomultipliers permits the detection of ionizing particles passing through the sensitive volume due to ionization processes inside the sensitive volume. When the charged particle passes the sensitive area of a silicon photomultiplier, it creates an electron hole pair due to ionization process, which initiates the avalanche process of amplification and gives a high signal to noise ratio even at the room temperature.

A problem arising from the use of silicon photomultipliers in the detection of the ionizing particles is that a signal produced by the breakdown-mode micro-cell is not proportional to the number of carriers created in the sensitive volume. Because of this loss of linearity, a signal produced by absorbed ionizing particles is indistinguishable from signals produced by a thermally generated electron/hole pair, known as dark rate pulses. As a result, the signal detection efficiency is reduced in both the intensity measurement mode and the coordinate detection mode.

SUMMARY OF THE INVENTION

A first aspect of the invention provides an avalanche pixel sensor. The avalanche pixel sensor includes a substrate having opposite first and second surfaces, a first avalanche sensor element operating in breakdown mode situated on the first surface of the substrate for detecting ionizing radiation from a radiation-emission source, a second avalanche sensor element operating in breakdown mode situated on the second surface of the substrate, the second avalanche sensor element situated to detect the ionizing radiation detected by the first avalanche sensor element and experience substantially coincident breakdown with the first avalanche sensor element in response to the ionizing radiation, and a logic element electrically interconnected to the first and second avalanche sensor elements for receiving a signal or signals created by the substantially coincident breakdown of the first and second avalanche sensor elements and permitting the signal or signals to be distinguished from a dark signal event in either of the first and second sensor elements.

A second aspect of the invention provides an avalanche pixel sensor including a substrate having opposite first and second surfaces, first avalanche sensor elements operating in breakdown mode situated on the first surface of the substrate for detecting ionizing radiation from a radiation-emission source, second avalanche sensor elements operating in breakdown mode situated on the second surface of the substrate, each of the second avalanche sensor elements being paired with a corresponding first avalanche sensor element of the first avalanche sensor elements to experience substantially coincident breakdown with the corresponding first avalanche sensor element in response to the ionizing radiation, and logic elements each electrically interconnected to a respective pair of the first and second avalanche sensor elements for receiving a signal or signals created by the substantially coincident breakdown of the respective pair and permitting the signal or signals to be distinguished from a dark signal event in either of the corresponding first and second sensor elements.

A third aspect of the invention provides a position sensitive avalanche sensor array, which includes a common electrode, a substrate having opposing first and second surfaces, a plurality of (N) sensor pairs on the first and second surfaces of the substrate, and logic elements for quenching and outputting a serial pulse signal to the common electrode. The output signals contain intensity information corresponding to the number of sensor pairs activated during a charged particle flux exposure.

A fourth aspect of the invention provides a sensing apparatus. The sensing apparatus includes a plurality of sensor elements for sensing radiation, the sensor elements being arranged in proximate sensor element pairs, and a plurality of logic elements in communication with corresponding proximate sensor element pairs, each of the logic elements receiving outputs from the sensor elements in the corresponding proximate sensor element pair. The logic elements decide that radiation is detected when at least two of the sensor elements in the corresponding proximate sensor element pairs are triggered, and decide that a dark signal event has occurred when less than two of the sensor element in the corresponding proximate sensor element pairs are triggered.

A fifth aspect of the invention provides a method of detecting ionizing radiation using first and second sensor elements disposed proximately at opposite sides of a substrate. The method includes determining an output of the first and second sensor elements, and ANDing the outputs of the first and second sensor elements. It is determined that a dark signal event has occurred when a result of the ANDing operation is logic low. It is determined that ionizing radiation has been detected when the result of the ANDing operation is logic high.

A sixth aspect of the invention provides a method of sensing ionizing radiation using first and second sensor elements disposed proximately on opposite sides of a substrate. The method comprises determining an output of the first and second sensor elements, performing a Boolean logic operation on the outputs of the first and second sensor elements to determine whether both the first and second sensor elements have been activated, and determining that a dark signal event has occurred when a result of the Boolean logic operation is not true and determining that ionizing radiation has been detected when the result of the Boolean logic operation is true.

Additional aspects of the invention are described below in connection with the detailed description and attached figures, and include, for example, the sub-modules, imaging apparatus, systems, arrays, meta-arrays, photosensors, and methods of the aspects described below and the embodiments detailed below.

BRIEF DESCRIPTION OF THE DRAWINGS

The accompanying drawings are incorporated in and constitute a part of the specification. The drawings, together with the general description given above and the detailed description of the preferred embodiments and methods given below, serve to explain the principles of the invention. In such drawings.

Figure 1:
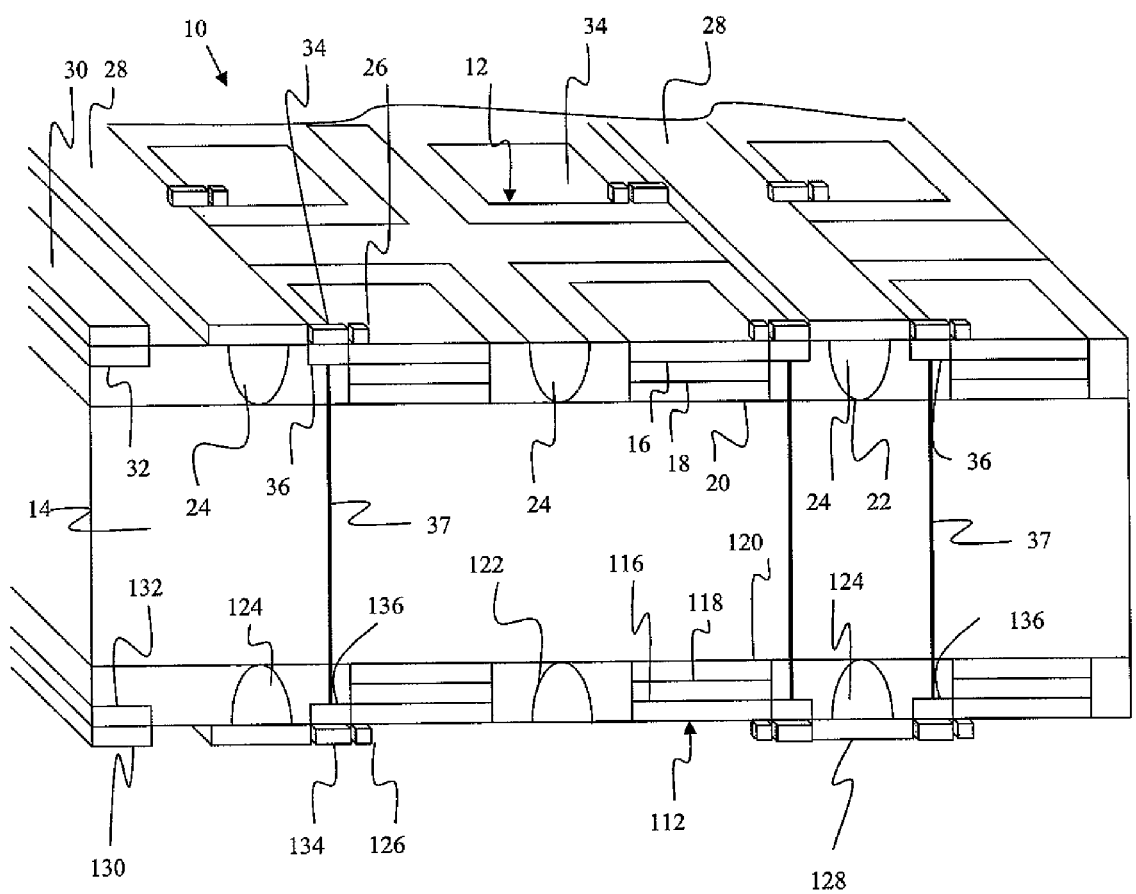
FIG. 1 is a cross-sectional, perspective view of a sensor.

DETAILED DESCRIPTION OF PREFERRED EMBODIMENTS AND PREFERRED METHODS OF THE INVENTION

Reference will now be made in detail to the presently preferred embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in this section in connection with the preferred embodiments and methods. The invention according to its various aspects is particularly pointed out and distinctly claimed in the attached claims read in view of this specification, and appropriate equivalents.

FIG. 1 is a perspective view of an avalanche pixel sensor 10 according to an embodiment of the invention comprising opposing first and second sensitive detector arrays. The first (or upper in FIG. 1) detector array features sensor elements or tiles 12 arranged in a matrix, i.e., six sensor elements 12 are illustrated in the upper array of FIG. 1, nine sensor elements 12 are illustrated in the expanded view of the upper array of FIG. 2. The second (or lower in FIG. 1) detector array of avalanche pixel sensor 10 features sensor elements or tiles generally designated by reference numeral 112. In a particularly preferred embodiment of the invention, each sensor element 12, 112 (also referred to herein as "detectors" or "detector pairs") constitutes an avalanche photodiode, preferably operating in non-linear breakdown mode. Interposed between the first and second sensor arrays is a common substrate 14, preferably made of silicon, although it should be understood that other semiconductor materials may be selected.

Sensor elements 12, 112 are formed in epitaxial layers of silicon deposited on the opposite surfaces of common substrate 14. Sensor elements 12 of the first sensor array each comprise a breakdown region comprising $n^+$-type region 16 and p-type region 18 immediately adjacent to $n^+$-type region 16 to establish a pn junction. (The terms "layer" and "region" are used interchangeably herein.) A drift region 20 is a lightly doped p-type region separating p-type region 18 from common substrate 14, which also may be lightly p-doped. Similarly, sensor elements 112 of the second sensor array comprise a breakdown region comprising $n^+$-type region 116 and p-type region 118 immediately adjacent to $n^+$-type region 116 to establish a pn junction, and a drift region 120. Epitaxial deposition techniques are known in the art and can be practiced to deposit a sensor layer from which sensor elements 12, 112 are fabricated.

Creation of $n^+$-type regions 16, 116, p-type regions 18, 118, and drift regions 120 may be accomplished, for example, using standard doping and/or lithographic techniques. This detailed description refers to a pn junction in which the p-type regions 18, 118 are in closer proximity to common substrate 14 than $n^+$-type regions 16, 116. It should be understood that these regions may be transposed.

Sensor elements 12, 112 are illustrated as possessing a square-shaped area viewed from above, possessing dimensions of about 10 microns by about 10 microns, for example, although other shapes and dimensions may be selected. Although not particularly limited, the first and second sensor arrays may include, for example, between hundred(s) and thousand(s) of sensor elements 12, 112, although fewer or more sensor elements 12, 112 may be included in the pixel sensor 10. It is within the scope of the invention to provide pixel sensor 10 with a single upper sensor element 12 and a single lower sensor element 112. Further, pixel sensor 10 may possess sensor elements 12, 112 in arrangements other than that depicted in FIG. 1. For example, sensor elements 12, 112 may be arranged in a non-grid pattern, i.e., without set columns and/or rows. Sensor elements 12, 112 alternatively may be arranged in one-dimensional arrays. Sensor elements 12, 112 may be mounted or formed directly or indirectly on a single substrate 14 or on multiple substrates. Intervening layers may be interposed between substrate 14 and sensor elements 12, 112.

As will be explained in further detail below, each sensor element 12 of the first (upper) sensor array is paired with a corresponding sensor element 112 of the second (lower) sensor array so that ionizing radiation detected by one of the sensor elements 12 is also detected by its corresponding sensor element 112 of the pair. In the illustrated embodiment, sensor elements 12, 112 of the first and second sensor arrays are paired to symmetrically align with one another across substrate 14.

Grids of trenches 22, 122 are preferably formed in the upper and lower epitaxial layers, respectively, using known standard lithographic processes, e.g., dry or wet etching. Lithography may take place before or subsequent to doping of $n^+$-type regions 16, 116 and p-type regions 18, 118. Advantageously, trenches 22, 122 are relatively narrow to consume relative small amounts of area. As depicted in FIG. 1, trenches 22, 122 extend completely through the epitaxial layer to substrate 14. It should be understood that trenches 22, 122 may alternatively penetrate only partially through the respective epitaxial layers.

Trenches 22 may be partially or completely filled with optical isolating elements or material 24 for optically isolating sensor elements 12 from one another and thereby substantially reducing or eliminating optical cross-talk between sensor elements 12. Likewise, trenches 122 may be partially or completely filled with optical isolating elements or material 124 for optically isolating sensor elements 112 from one another and thereby substantially reducing or eliminating optical cross-talk between sensor elements 112. Optical isolating elements 24, 124 comprise an optically non-conductive material, such as a polyimide or metal capable of substantially eliminating cross-talk, partially or completely filling trenches 22, 122. Preferably, the optical isolating elements 24, 124 permit less than 1.0 percent, more preferably less than 0.1 percent of the photons generated during the avalanche process (discussed below) from traveling between individual sensor elements 12 (or between sensor elements 112). The degree of optical and/or electrical isolation may be varied according to the preferred intended use, for example, by controlling the dimensions of trenches 22, 122 and the selection of optical isolating elements 24, 124. Further, trenches 22, 122 may be filled with alternative materials.

Figure 2:
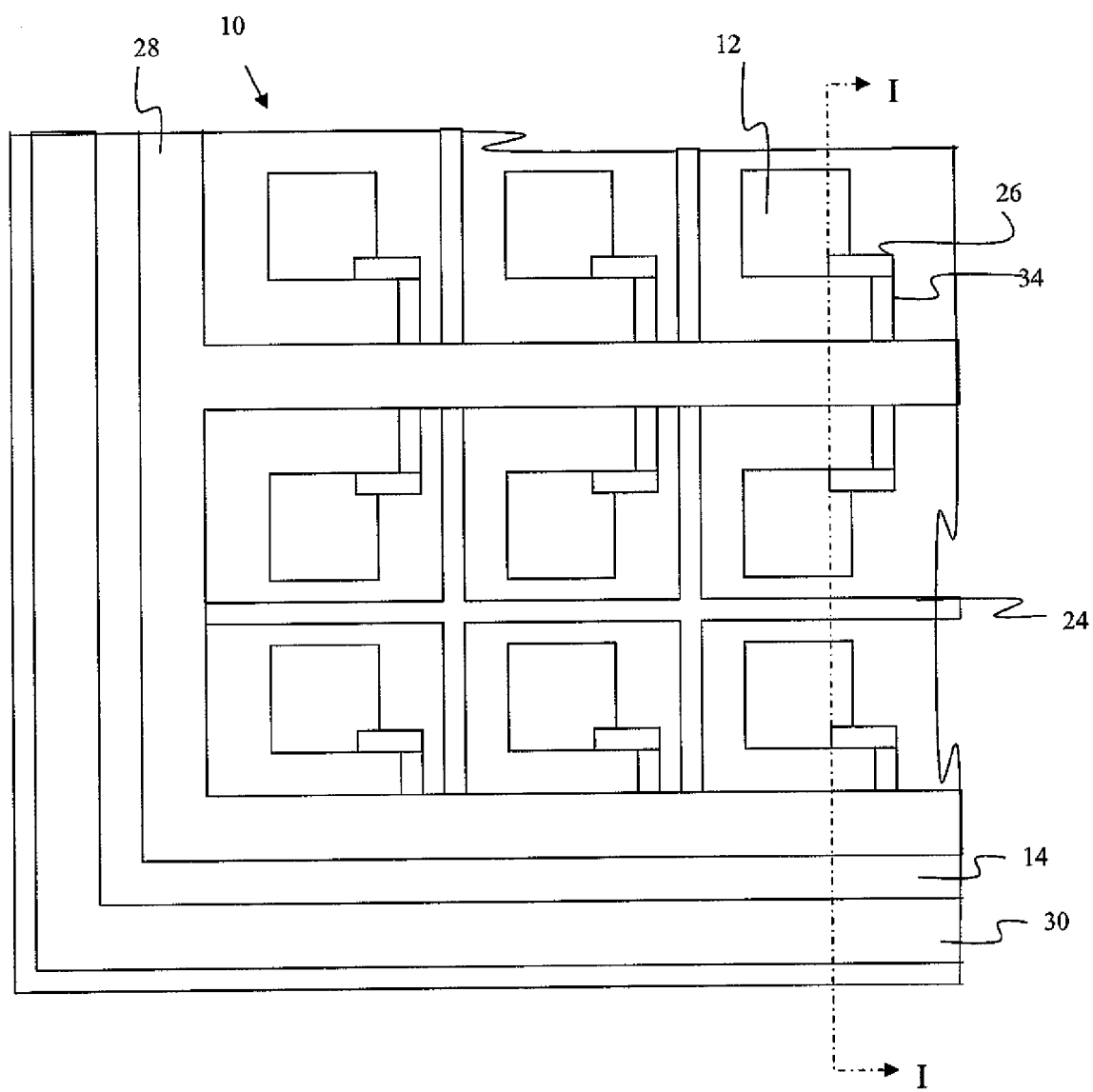
FIG. 2 is an overhead view of the sensor of FIG. 1.

As further illustrated in FIG. 1, first electrode 28 of the upper array is positioned over trenches 22 and optical isolating elements 24. As best shown in FIG. 2, first electrode 28 includes a main body portion also extending in a front-to-rear direction of FIG. 2, and two stem portions extending in a direction from side-to-side of substrate 14. First electrode 128 of the lower array is likewise situated over trenches 122 and optical isolating elements 124. It should be understood that electrodes 28, 128 may be situated at alternative locations, such as buried in trenches 22, 122.

As best shown in FIG. 1, the upper array includes a $p^{++}$-type layer 32, and the lower array includes a $p^{++}$-type layer 132. Common or second electrodes 30, 130 are positioned over the exposed surfaces of $p^{++}$-type layer 32, 132, respectively. The $p^{++}$-type layer 32, 132 acts as a contact layer to allow flow to/from the sensors 12, 112 to the electrodes 30 through common substrate 14. Electrodes 28, 30, 128, 130 are made, for example, of a thin layer of metal (e.g., aluminum and/or titanium) or other suitable conductive material.

The upper array includes a quenching element 26 for each sensor element 12. Connectors 34 electrically interconnect quenching elements 26 to first electrode 28. As shown in FIG. 1, each sensor element 112 also is associated with a corresponding quenching element 126. Connectors 134 electrically interconnect quenching elements 126 to lower first electrode 128. The first electrodes 28, 128 provide power (PWR-Vdd) to the sensor elements 12, 112 via the connectors 34, 134 and the quenching elements 26, 126. Similarly, the second electrodes 30, 130 provide a ground (GND-Vss) to the sensor elements 12, 112 through the common substrate 14. As used herein, the term "interconnected" and derivatives of the term (e.g., interconnect, interconnecting) encompass both direct and indirect connections between elements, especially as the term is use in relation to electrical interconnections.

A logic element 36, such as an AND gate, receives output values from sensor elements 12 and 112. Logic element 36 may comprise a pair of logic elements 36 and 136, as shown in FIG. 1. Logic element 36 is connected to quenching element 26 to receive the voltage between sensor element 12 and quenching element 26. Additionally, logic element 136 is connected to quenching element 126. A communication line 37 connects logic elements 36/136. For the purposes of this application, logic elements 36 and 136 are sometimes referred to as a logic element 36 (or 36/136). Logic element 36/136 applies a Boolean logic function to the output signal or signals of sensor elements 12 and 112 to determine whether top and bottom sensor elements 12 and 112 are simultaneously activated indicating that ionizing radiation has been received. It should be understood that logic element 36 and quenching element 26 may be integrated, and that logic element 136 and quenching element 126 likewise may be integrated.

Communication line 37 may be a conductive line extending through common substrate 14. Additionally, logic element 36/136 is connected to output of sensor elements 12 and 112, that is, between the pn junctions of sensor elements 12 and 112 and their respective quenching elements 26 and 126. For example, logic elements 36 may be connected to $n^+$-type regions 16, 116 of sensor elements 12, 112. It should be understood that the placement and arrangement of logic elements 36/136 and communication line 37 shown in FIG. 1 is intended to be exemplary, because the placement of logic elements 36/136 and communication line 37 can be changed without departing from the scope of the invention.

Figure 3:
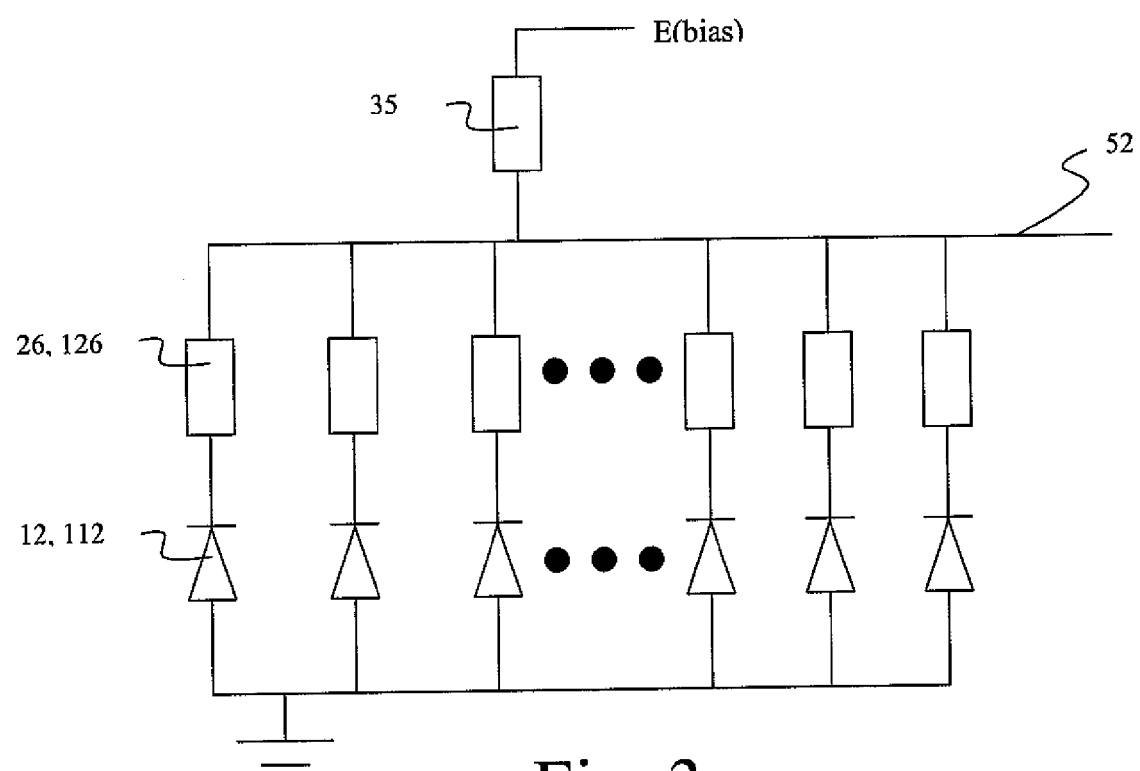
FIG. 3 is a sensor circuit diagram.

A sensor circuit for operation of each of the sensor arrays is illustrated in FIG. 3. Sensor elements 12 are arranged in parallel, with only a small number of sensor elements 12 shown for simplification purposes. Sensor elements 12, 112 are preferably operated in the so-called breakdown mode. Breakdown mode entails applying a reverse bias voltage $E_{bias}$ to sensor elements 12, 112. The electric field is typically a few volts greater than the breakdown voltage. The reverse bias voltage $E_{bias}$ may be applied from either of common electrodes 28/128 or 30/130, i.e., it is within the scope of the invention to reverse polarity of the pixel. A resistive or impedance component 35 may also be provided.

The reverse bias voltage $E_{bias}$ increases the electric field in the depletion regions between $n^+$-type regions 16/116 and p-type 18/118 regions. The electric field created by the reverse bias is at a maximum at the pn junction, and then decreases gradually through p-type regions 18/118.

The interaction of ionizing radiation with sensor element 12, 112 generates electron-hole pairs. The nearly uniform field of the depletion zone separates the electron—hole pair, causing the electron and hole to be driven towards the $n^+$ and p sides, respectively, of the pn junction formed at the interface of the p-type region 18, 118 and the n+ type region 16, 116. When the drifting electron reaches the pn junction, the electron experiences the high electric field and accelerates and collides with the silicon atomic structure, releasing additional electrons and holes via secondary ionization, known as an avalanche.

The radiation emission source may comprise charged particles, for example, ionizing particles may be generated by radioactive isotopes utilized in various types of applications including, but not limited to, high energy physics, homeland security, PET imaging, SPECT imaging, medical imaging, Compton Imaging, etc. It is envisioned that other electromagnetic radiation sources and other forms of ionizing radiation (e.g., ionization particles) may be used to fire the radiation-sensitive elements.

FIG. 3 illustrates each sensor element 12, 112 arranged in series with a respective quenching element 26, 126. Quenching elements 26, 126 are provided to, among other things, stop or "quench" the avalanche process. Essentially, one of the functions of quenching elements 26, 126 is to act as a passive mode quenching element to reset sensor elements 12, 112 to an off state. Quenching elements 26, 126 may be produced by complementary metal-oxide-semiconductor (CMOS)-compatible technology, preferably using poly-silicon (or alternatively silicon carbide) for reaching the high resistive values required for effective quenching. It should be understood that various quenching devices may be selected for use with the present invention, including active quenching devices (e.g., triggerable circuits).

The breakdown mode in which sensor elements 12, 112 are preferably operated produces a non-linear response, i.e., the response of a single sensor element 12, 112 is not proportional to the number of electron-hole pairs created in that single sensor element 12, 112 by a charged particle and produces the same signal, because the high reverse bias causes even a single electron-hole pair to generate an avalanche leading to current saturation.

The high sensitivity of avalanche pixel sensors operated in breakdown mode can lead to spontaneous breakdown processes. Specifically, a sensor element 12 or 112 can undergo spontaneous breakdown due to thermal generation of an electron-hole pair, resulting in the production of a dark rate signal (a signal/pulse contributing to dark current). Because the breakdown mode in which sensor elements 12, 112 are operated produces a non-linear response, signals produced by the spontaneous breakdowns responsible for dark rate signals usually cannot be distinguished from signals produced by ionizing radiation-induced breakdowns in conventional apparatus.

Figure 4:
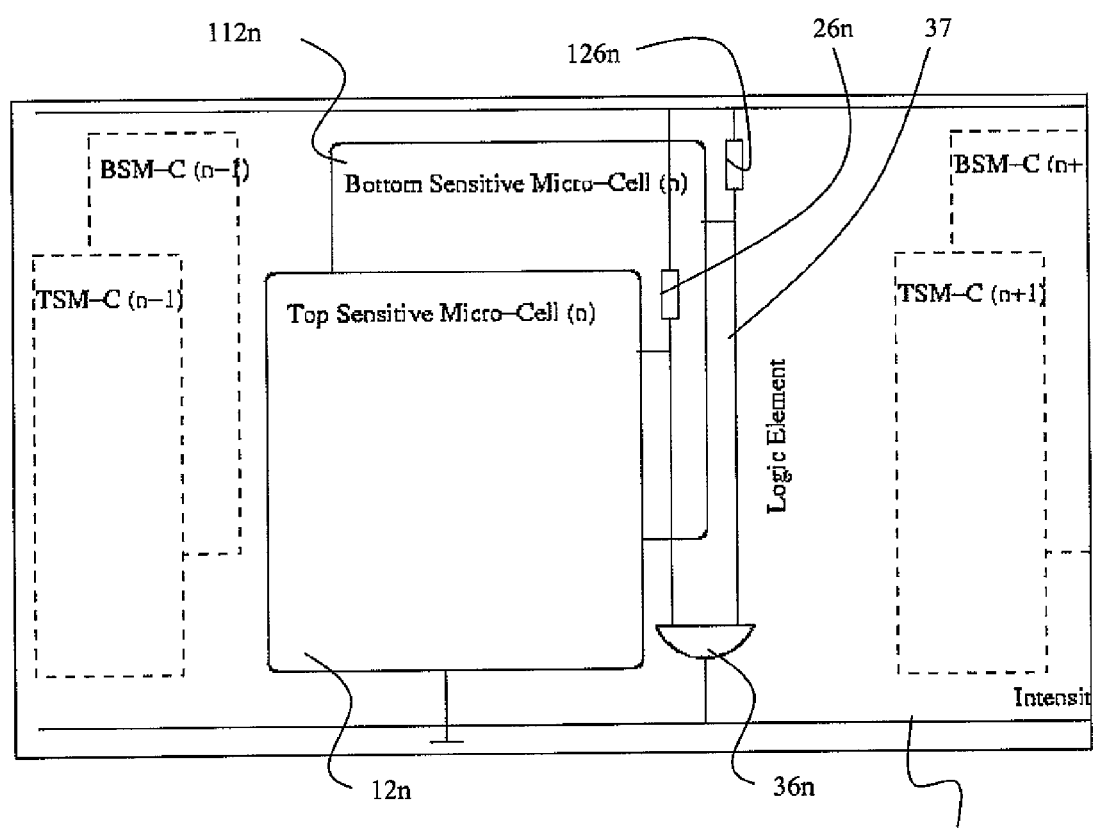
FIG. 4 is a block diagram of associated first and second sensor arrays according to an embodiment of the invention.

To overcome this problem and identify the source of a breakdown, even one producing a non-linear response, pixel sensor 10 further comprises logic elements 36 each electrically interconnected to a corresponding sensor element 12 of the upper array and a corresponding sensor element 112 of the lower array. Logic elements 36/136 may be AND gates, NAND gates, or the like. The corresponding sensor elements 12, 112 interconnected to a logic element 36/136 are positioned on opposite sides of substrate 14 in a relationship such that charged particles that impinge on one of first sensor elements 12 passes through substrate 14 and impinges on a corresponding second sensor element 112. Logic element 36/136 detects for the substantially simultaneous breakdown of the corresponding sensor elements. Referring to FIG. 4, if logic element 36n detects substantially simultaneous breakdown of sensor elements 12n and 112n, then the breakdown is assumed to be caused by ionizing radiation from a radiation source, and a signal is sent to readout line 38. However, if logic element 26n detects breakdown in either sensor element 12n, 112n but not the other, the isolated breakdown is assumed to have been caused by a dark event, which tend to occur independently of one another.

As shown in FIG. 4, an "Intensity" line receives all the outputs from the logic elements 36. Although not shown, an intensity determination unit connected to the intensity line accumulates, counts, sums, or adds all the logic high outputs from the logic elements 36 in order to determine the intensity of the ionizing radiation. The intensity determination unit may be a counting circuit, summing circuit, an accumulating circuit, or the like. The number of triggered elements represents the intensity of the ionizing radiation.

Figure 5:
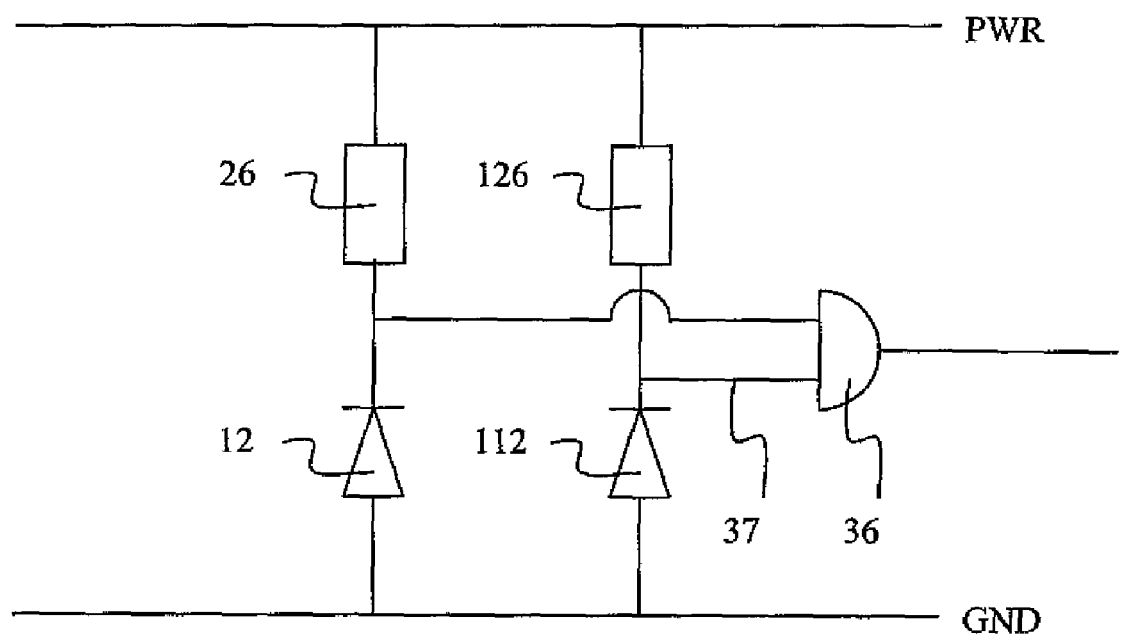
FIG. 5 is an equivalent circuit diagram of a detector pair of FIG. 4.

FIG. 5 shows a top and bottom sensor element 12n, 112n pair equivalent circuit diagram for the apparatus shown in FIG. 4. The sensor diodes 12 and 112 are reverse-biased by applying a reverse bias voltage via a power line (PWR-Vdd) and a ground line (GND-Vss). By reverse biasing sensor diodes 12 and 112, an avalanche process can be created by a charged particle, thereby making the sensor arrays extremely sensitive. However, due to their extreme sensitivity, the sensor arrays are also more susceptible to dark signal events caused by thermal noise. The output values of sensor diodes 12 and 112 are electrically connected to logic element 36/136 to determine whether both sensor diodes 12 and 112 are activated during the same time frame or sensor operation cycle. Logic element 36/136 may be an AND gate that produces a logic output to indicate when both sensor diodes 12 and 112 are activated. The output of logic element 36 may be provided to an intensity determination unit, such as a counter, adder, or accumulator, or a coordinate detection apparatus 200 (FIG. 7), which are described below.

As briefly discussed above, the quenching elements 26 and 126 reset the sensor elements 12 and 112 once the avalanche has occurred. As the avalanche effect occurs through sensor elements 12 and 112, current flows in the reverse direction through sensor elements 12 and 112 toward GND. As current through sensor elements 12 and 112 increases exponentially or avalanches, the voltage drop across sensor elements 12 and 112 also increases, thereby raising the output of these sensor elements 12 and 112 to a logic high voltage. Quenching elements 26 and 126 are large resistances that "slow down" the avalanche process when current created by sensor elements 12 and 112 increases to a certain level. Because quenching elements 26 and 126 are large resistances, the avalanche current is reduced gradually until reaching a value less than breakdown voltage. Accordingly, the output of these sensor elements 12 and 112 becomes a logic low voltage, again. Thus, quenching elements 26 and 126 act as feedback mechanisms to allow avalanching to occur, then stop the avalanching to reset sensor elements 12, 112 once the voltage and current in the sensor elements 12, 112 have reached a certain level.

Figure 6:
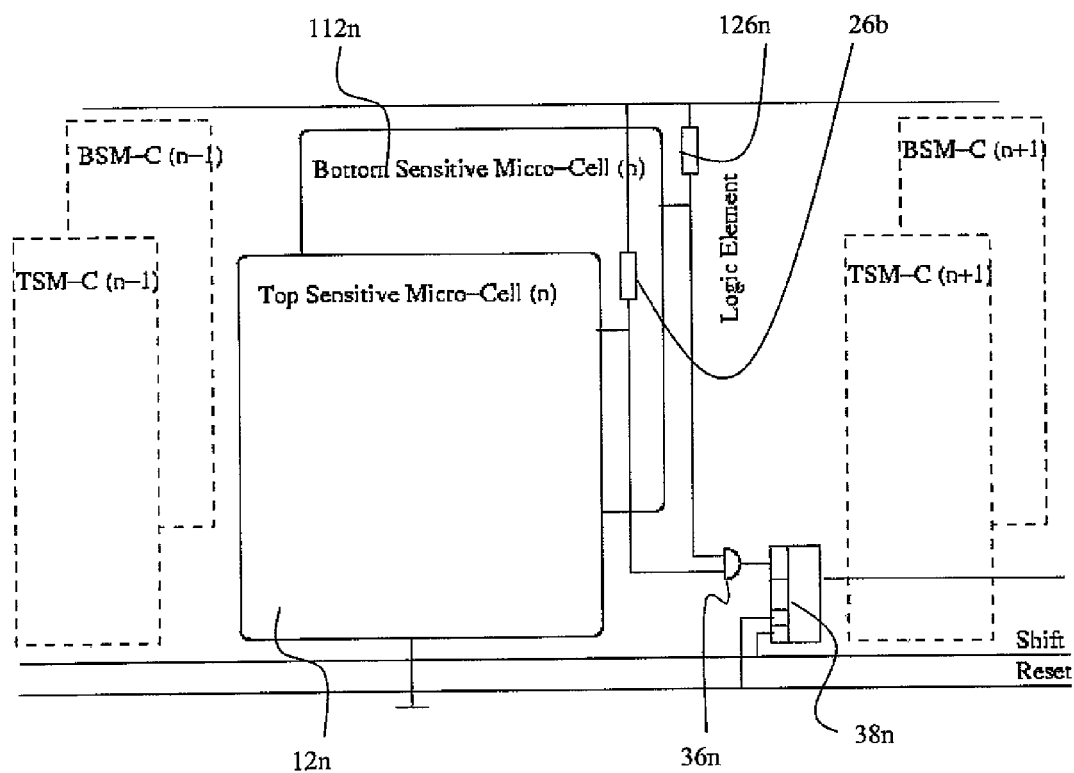
FIG. 6 is a block diagram of associated first and second sensor arrays according to another embodiment of the invention.

Generally, when a radiation emission source is activated, ionizing particles will simultaneously fire a plurality of sensor element pairs 12, 112. The configuration shown in FIG. 6 can be used to determine coordinate information of the sensor element pairs 12, 112 that are activated. Signals from logic elements, e.g., 36$n$, are provided to coordinate output elements, e.g., 39$n$ of the fired sensor element pairs 12$n$, 112$n$. The coordinate output elements 39$n$ output a pulse to readout line 38 to indicate that the corresponding sensor element pair 12$n$, 112$n$ has sensed ionizing radiation. Although not shown in FIG. 6, neighboring sensor element pairs 12$n$−1, 112$n$−1 (TSM-C(n−1), BSM-C(n−1)) and 12$n$+1, 112$n$+1 (TSM-C(n+1), BSM-C(n+1)) also include corresponding coordinate output elements 39$n$−1 and 39$n$+1, respectively. The "Shift" and "Reset" lines are used to control the output and resetting of the coordinate output elements 39.

The coordinate output elements 39 may be temporary storage devices that store then readout the output of the corresponding logic elements 36. The coordinate output elements 39 may be controlled to output coordinate information serially or in parallel. As described below with reference to FIG. 7, when the coordinate output elements 39 are controlled to output data serially, the particular sensor element pair, e.g., 12$n$, 112$n$ associated with the data being output may be determined based on timing information of the output, for example, by the particular clock cycle or time slot during which the data pulse is output. To this end, the coordinate output elements 39 may have logic for delaying each of the respective outputs of the sensor element pairs 12, 112 so that data for each of the sensor element pairs 12, 112 can be read out during an associated time slot or clock cycle. In this case, because the readout line 38 is connected to each of the coordinate output elements 39, the readout line 38 receives pulses from each of the coordinate output elements 39$n$−1, 39$n$, 39$n$+1, etc. serially.

Figure 7:
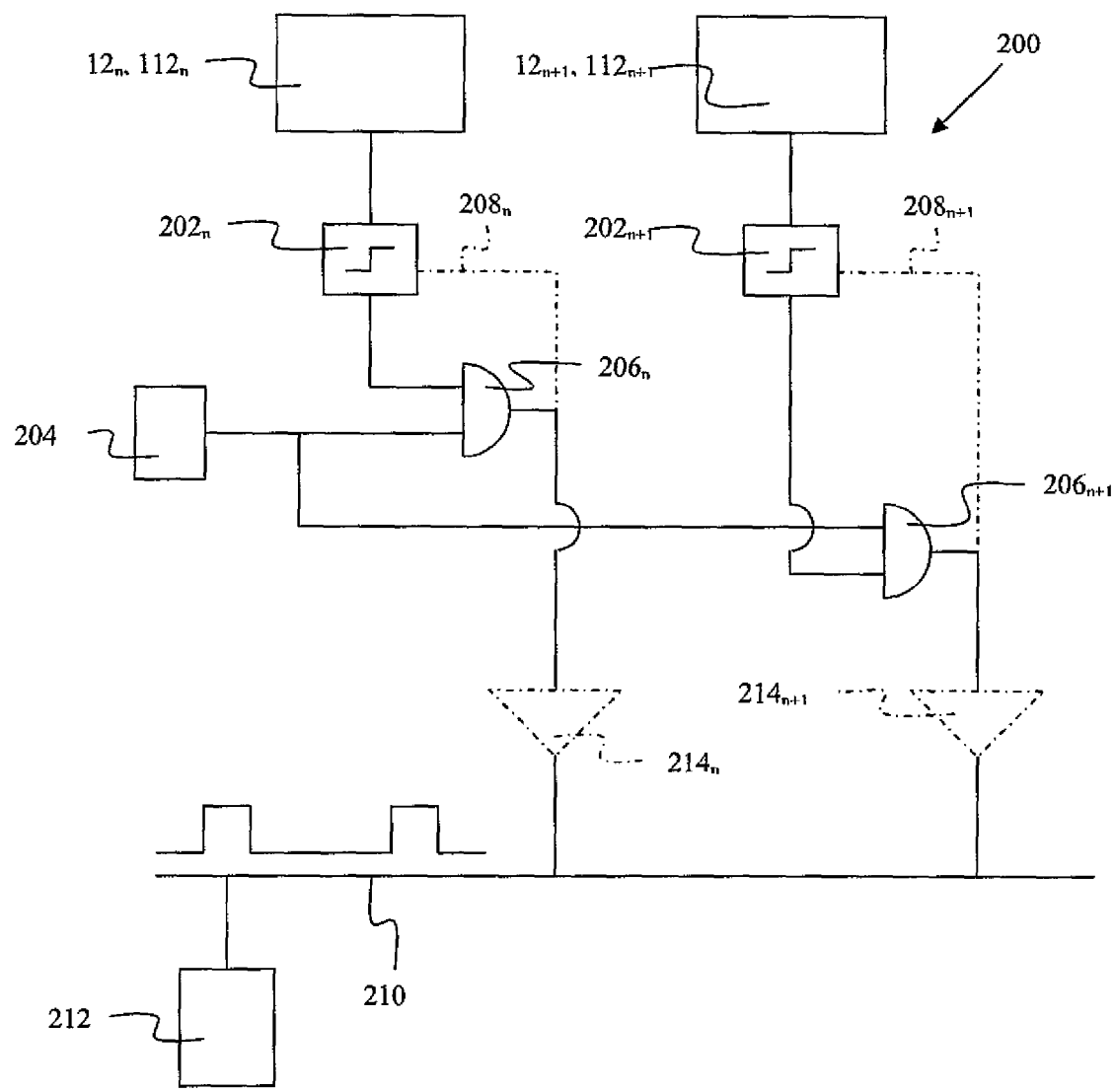
FIG. 7 is an exemplary logic diagram illustrating a coordinate detection apparatus associated with detector pairs according to yet another embodiment of the invention.

FIG. 7 is an exemplary logic diagram illustrating an avalanche pixel sensor apparatus 200 associated with first and second sensor arrays according to yet another embodiment of the invention. References 12$n$, 112$n$ and 12$n$+1, 112$n$+1 represent top and bottom sensor element pairs. Although not shown in this figure, these pairs include corresponding logic elements 36 (see FIG. 5A) that produce a logic output when the sensor element pairs are activated.

Trigger storage elements 202$n$ and 202$n$+1 are activated to change state when the corresponding sensor element pairs 12$n$, 112$n$ and 12$n$+1, 112$n$+1, respectively, output a logic voltage indicating an ionizing radiation activation event. The trigger storage elements 202$n$ and 202$n$+1 may take the form of edge-triggered registers or flip-flops clocked or triggered by the output of the corresponding logic element 36 of the corresponding sensing element pair 12$n$, 112$n$. The output of the trigger storage elements 202$n$ and 202$n$+1 are provided to corresponding pulse output units 206$n$ and 206$n$+1, which may be logic elements such as AND gates. The pulse output units 206$n$ and 206$n$+1 receive a clock signal from a clock source 204. The pulse output units 206$n$ and 206$n$+1 output pulses corresponding to clock pulses onto a serial pulse output line 210 when a logic high output is received from the corresponding trigger storage elements 202$n$ and 202$n$+1. In other words, the outputs of the trigger storage elements 202$n$ and 202$n$+1 are changed into pulses by gating them with the clock from clock source 204 in the corresponding pulse output units 206$n$. Due to the arrangement of the pulse output units 206$n$ and 206$n$+1 along the pulse output serial line 210, coordinate information can be determined by the sequence of the pulses along the pulse output serial line 210.

That is, for N sensor element pairs 12, 112, N clock cycles can be used to indicate whether the N sensor element pairs 12, 112 have been activated by outputting a pulse during specific clock cycles that correspond to specific sensor element pairs 12, 112 being activated. Thus, each sensor element pair 12, 112 is allotted a time slot during which it outputs whether or not it has been activated.

Referring back to FIG. 7, although pulse output units 206$n$ and 206$n$+1 are shown as being directly connected to pulse output serial line 210, it should be understood that timing delay elements, such as buffers, may be used to offset the output pulses from pulse output units 206$n$ and 206$n$+1 such that each output corresponds to its own time slot or clock cycle. For example, the 1$^{st}$ pulse output unit 206$n$=1 may be directly connected to pulse output serial line 210 while the nth pulse output unit 206$n$=n may be connected to pulse output serial line 210 through n buffers, each of which delay the signal for a single clock cycle. Alternatively, each pulse output unit 206$n$ may be associated with a delay element 214$n$ that introduces a predetermined delay. Delay elements 214 and 214$n$+1 are depicted with dashed lines in FIG. 7. In this manner, each pulse is output on serial line 210 at different times. A digital shift register or an analog serializer may also be used to introduce the predetermined delay to each pulse from the pulse output unit 206$n$. Pulse output serial line 210 may be part of a bus. Shift register schemes for reading sensor arrays are known, as described, for example in U.S. Patent Application Publication No. 2005/0012033 to Stem et al., entitled "Digital Photo-Counting Geiger-Mode Avalanche Photodiode Solid-State Monolithic Intensity Imaging Focal Plane With Scalable Readout Circuitry."

Thus, each operation cycle for sensor 10 shown in FIG. 1 may include at least clock cycles or time slots (corresponding to "n" detector pairs) in order to detect coordinate information about the activation events of sensor element pairs 12, 112. In other words, at the beginning of each operation cycle of sensor 10, all N sensor element pairs 12, 112 detect whether ionizing radiation is received. Following this detection operation, N clock cycles or time slots are used to output pulses when the corresponding sensor element pairs 12, 112 have been activated and no pulse when the corresponding sensor element pairs 12, 112 have not been activated. This process is referred to as "data readout."

As best shown in FIG. 7, a pulse determination unit 212 receives the serial pulses and determines coordinate information therefrom. For example, assume N=10,000 sensor element pairs 12, 112 arranged in a 100×100 matrix, and the 475$^{th}$ sensor element pair has coordinates of (5, 75) within the 100×100 matrix. If a pulse is received during the 475$^{th}$ clock cycle, pulse determination unit 212 decides that the sensor element pair 12, 112 positioned in the 5$^{th}$ column and the 75$^{th}$ row of the matrix has been activated. The specific coordinate information may be stored in a look-up table in correspondence with the sensor pair number (1, . . . , N).

The trigger storage elements 202$n$ and 202$n$+1 change from logic low output to logic high output when they are activated. Once the trigger storage elements 202$n$ and 202$n$+1 are activated to logic high output, this output is provided to the pulse output units 206$n$ and 206$n$+1. Thus, the AND gates 206$n$ and 206$n$+1 output a pulse when the output of the corresponding trigger storage elements 202$n$ and 202$n$+1 is present. Once a pulse has been output by the AND gates 206$n$ and 206$n$+1, the corresponding trigger storage elements 202$n$ and 202$n$+1 are reset to their original state, logic low output, until another activation event occurs to the same sensor element pair 12, 112. To this end, reset lines 208$n$ and 208$n$+1 denoted by a dashed line in FIG. 7 may be fed back from the pulse output units 206$n$ and 206$n$+1 to the corresponding trigger storage elements 202$n$ and 202$n$+1, respectively, to reset these trigger storage elements 202$n$ and 202$n$+1 once their outputs have been read. Alternatively, reset lines may extend from the pulse determination unit 212 to the trigger storage elements 202n and 202n+1 so that the pulse determination unit 212 can reset the trigger storage elements 202n and 202n+1 when it is determined that the corresponding sensor element pair 12, 112 has been activated.

The coordinate detection apparatus 200 shown in FIG. 7 may provide a single serial output with coordinate data in the form of serial pulses so as to avoid a large number of parallel outputs. The pulse determination unit 212 may be part of a computer, computer program, or other apparatus that reads the pulse data to interpret coordinate information, for example, based on coordinates stored in a look-up table.

In an alternative embodiment of the invention, coordinate data from pulse output units 206n and 206n+1 may be read out in parallel using N lines on an input/output bus. In this case, the operation cycle time of the sensor arrays may be made shorter, because N clock cycles are not necessary to output coordinate data serially. It should be understood that components shown in FIG. 7 may correspond to the coordinate output elements, e.g., 39n shown in FIG. 6. For example, the readout line 38 in FIG. 6 may correspond to the pulse output serial line 210 shown in FIG. 7.

While this invention has been described as having a preferred design, it is understood that it is capable of further modifications, uses and/or adaptations of the invention, following in general the principle of the invention and including such departures from the present disclosure as come within known or customary practice in the art to which the invention pertains, and as may be applied to the central features hereinbefore set forth, and fall within the scope of the invention of the limits of the appended claims.

What is claimed is:

1. An avalanche pixel sensor, comprising:
a substrate having opposite first and second surfaces;
a first avalanche sensor element operating in breakdown mode situated on the first surface of the substrate for detecting ionizing radiation from a radiation-emission source;
a second avalanche sensor element operating in breakdown mode situated on the second surface of the substrate, the second avalanche sensor element situated to detect the ionizing radiation detected by the first avalanche sensor element and experience substantially coincident breakdown with the first avalanche sensor element in response to the ionizing radiation; and
a logic element electrically interconnected to the first and second avalanche sensor elements for receiving a signal or signals created by the substantially coincident breakdown of the first and second sensor elements and permit the signal or signals to be distinguished from a dark signal event in either the first or the second sensor element.

2. The avalanche pixel sensor of claim 1, further comprising:
first and second resistive quenching elements arranged in series and electrically interconnected to the first and second avalanche sensor elements, respectively, to provide avalanche process suppression and resetting of the first and second avalanche sensor elements.

3. The avalanche pixel sensor of claim 2, further comprising reverse biasing means for operating the first and second avalanche sensor elements in breakdown mode.

4. The avalanche pixel sensor of claim 1, wherein the logic element is disposed at one of the first and second surfaces of the substrate.

5. The avalanche pixel sensor of claim 1, wherein the logic element comprises a first logic element electrically interconnected to the first avalanche sensor element and a second logic element electrically interconnected to the second avalanche sensor element.

6. The avalanche pixel sensor of claim 5, wherein the first and second logic elements comprise first and second resistive quenching elements, respectively, electrically interconnected to the first and second avalanche sensor elements, respectively, to provide avalanche process suppression and resetting of the first and second avalanche sensor elements.

7. An avalanche pixel sensor, comprising:
a substrate having opposite first and second surfaces;
first avalanche sensor elements operating in breakdown mode situated on the first surface of the substrate for detecting ionizing radiation from a radiation-emission source;
second avalanche sensor elements operating in breakdown mode situated on the second surface of the substrate, each of the second avalanche sensor elements being paired with a corresponding first avalanche sensor element of the first sensor elements to experience substantially coincident breakdown with the corresponding first avalanche sensor element in response to the ionizing radiation; and
logic elements each electrically interconnected to a respective pair of the first and second avalanche sensor elements for receiving a signal or signals created by the substantially coincident breakdown of the respective pair and permitting the signal or signals to be distinguished from a dark signal event in either of the pair of first and second sensor elements.

8. The avalanche pixel sensor of claim 7, further comprising:
first quenching elements electrically interconnected to the first avalanche sensor elements to provide avalanche process suppression and resetting of the first avalanche sensor elements; and
second quenching elements electrically interconnected to the second avalanche sensor elements to provide avalanche process suppression and resetting of the second avalanche sensor elements.

9. The avalanche pixel sensor of claim 8, further comprising reverse biasing means for operating the first and second sensor elements in breakdown mode.

10. The avalanche pixel sensor of claim 8, further comprising:
first optical isolating elements situated between the first avalanche sensor elements for optically isolating the first avalanche sensor elements from one another so as to substantially eliminate optical cross-talk between the first avalanche sensor elements; and
second optical isolating elements situated between the second avalanche sensor elements for optically isolating the second avalanche sensor elements from one another so as to substantially eliminate optical cross-talk between the second avalanche sensor elements.

11. The avalanche pixel sensor of claim 10, wherein the first optical isolating elements are situated in first trenches interposed between the first avalanche sensor elements, and the second optical isolating elements are situated in second trenches interposed between the second avalanche sensor elements.

12. The avalanche pixel sensor of claim 7, wherein each of the logic elements output a signal indicative of whether the corresponding first and second avalanche sensor elements both detect ionizing radiation.

13. The avalanche pixel sensor of claim 12, further comprising:
an intensity detection apparatus receiving outputs of the logic elements and counting a number of pairs of first and second avalanche sensor elements that have sensed ionizing radiation for determining the intensity of the ionizing radiation.

14. The avalanche pixel sensor of claim 12, further comprising:
a coordinate detection device receiving outputs of the logic elements and for outputting a serial pulse signal containing pulses corresponding to pairs of sensor elements that detect ionizing radiation during a predetermined detector operation cycle, the serial pulse signal having (N) time slots each corresponding to a specific pair of first and second avalanche sensor elements.

15. The avalanche pixel sensor of claim 12, wherein the logic elements comprise AND gates including first input terminals interconnected to outputs of the first avalanche sensor elements and second input terminals interconnected to outputs of the second avalanche sensor elements.

16. An avalanche pixel sensor array, comprising:
a common electrode;
a substrate having opposing first and second surfaces;
a plurality of (N) sensor pairs on the first and second surfaces of the substrate; and
logic elements for quenching and outputting a serial pulse signal to the common electrode, the output signals containing intensity information corresponding to the number of sensor pairs activated during a charged particle flux exposure.

17. The avalanche pixel sensor array of claim 16, wherein each of said sensor pairs comprises a first sensor disposed on the first surface of the substrate and a second sensor disposed on the second surface of the substrate opposite the first sensor, both said first and second sensors being activated when a charged particle is incident on a particular location of said substrate.

18. The avalanche pixel sensor array of claim 17, further comprising:
a plurality of (N) logic elements each associated with a corresponding sensor pair, each of said logic elements determining whether both the first and second sensors in the corresponding sensor pair have been activated.

19. The avalanche pixel sensor array of claim 18, wherein the logic elements distinguish between a dark signal event which only activates one of the first and second sensors and an ionizing radiation event that activates both the first and second sensors.

20. The avalanche pixel sensor array of claim 16, wherein each of the sensor pairs comprise:
first avalanche sensor elements operating in breakdown mode situated on the first surface of the substrate for detecting ionizing radiation from a radiation-emission source; and
second avalanche sensor elements operating in breakdown mode situated on the second surface of the substrate, the second sensor elements each situated to detect the ionizing radiation detected by a corresponding first sensor element of the first sensor elements and experience substantially coincident breakdown with the corresponding first sensor element.

21. The avalanche pixel sensor array of claim 16, further comprising coordinate detection apparatus which comprises:
a clock source for providing a clock signal;
a serial pulse line along which the serial pulse signal is output;
a plurality of trigger elements in communication with corresponding sensor pairs, said trigger elements being triggered when the corresponding sensor pair senses ionizing radiation; and
a plurality of pulse output units receiving the clock signal and outputs from the corresponding trigger elements, said pulse output units perfoiniing a logic operation to determine whether to output a pulse onto the serial pulse line for each of the sensor pairs during the corresponding time slot based on the clock signal and the output from the corresponding trigger elements such that the serial pulse signal output onto the serial pulse line indicates which of the sensor pairs sense ionizing radiation.

22. The avalanche pixel sensor array of claim 21, wherein the coordinate detection apparatus further comprises:
a pulse determination unit for receiving the serial pulse output on the serial pulse line and for determining coordinate locations of the sensor pairs that are activated based on which of the N time slots include a pulse.

23. A position sensitive avalanche sensor array, comprising:
a plurality of sensor elements for sensing radiation, said sensor elements being arranged in proximate sensor element pairs; and
a plurality of logic elements in communication with corresponding proximate sensor element pairs, each of said logic elements receiving outputs from the sensor elements in the corresponding proximate sensor element pair and deciding that radiation is detected when at least two of the sensor elements in the corresponding proximate sensor element pairs are triggered, and deciding that a dark signal event has occurred when less than two of the sensor elements in the corresponding proximate sensor element pairs are triggered.

24. The position sensitive avalanche sensor array of claim 23, further comprising a readout logic scheme for outputting a parallel or serial pulse signal containing data corresponding to sensor element pairs that are activated during a predetermined array operation cycle.

25. A method of sensing ionizing radiation using first and second sensor elements disposed proximately on opposite sides of a substrate, the method comprising:
determining an output of the first and second sensor elements disposed on the opposite sides of the substrate; and
performing a Boolean logic operation on the outputs of the first and second sensor elements to determine whether both the first and second sensor elements have been activated and determining that a dark signal event has occurred when a result of the Boolean logic operation is not true and determining that ionizing radiation has been detected when the result of the Boolean logic operation is true.

* * * * *